(12) United States Patent
Niimi et al.

(10) Patent No.: US 6,906,527 B1
(45) Date of Patent: Jun. 14, 2005

(54) PROXIMITY SENSOR

(75) Inventors: Chikashi Niimi, Ayabe (JP); Hiroyuki Fujinaga, Maizuru (JP); Koro Kitajima, Suita (JP); Keijiro Shoji, Kameoka (JP); Takao Nakazaki, Takatsuki (JP); Kazuhiro Hayashi, Ayabe (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/661,767

(22) Filed: Sep. 15, 2003

(30) Foreign Application Priority Data

Sep. 13, 2002 (JP) ...................... 2002-269267

(51) Int. Cl.[7] ........................... G01R 27/28; G01B 7/14
(52) U.S. Cl. ................... 324/633; 324/654; 324/207.15
(58) Field of Search ................. 324/629, 633, 324/207.13, 207.15, 207.22, 173, 174, 654; 73/649

(56) References Cited

U.S. PATENT DOCUMENTS 4,922,197 A * 5/1990 Juds et al. ............. 324/207.21
5,998,988 A * 12/1999 Dickmeyer et al. ......... 324/174

FOREIGN PATENT DOCUMENTS

JP     5-144524 A    6/1993
JP     2001-75117 A    3/2001

* cited by examiner

Primary Examiner—Vincent Q. Nguyen
(74) Attorney, Agent, or Firm—Foley & Lardner LLP

(57) ABSTRACT

A connector has a conductive terminal assembly including a plug-adaptable conductive terminal electrically connected with a circuit assembly and a pin holder for holding the conductive terminal The terminal assembly is sized to be able to be inserted from the front-end side of an outer shell case A cylindrical holding member has openings at both ends to enable the conductive terminal assembly to be inserted, a joint to position the conductive terminal assembly to itself, and is fixed from the rear-end side of the outer shell case. In addition, the detection coil assembly and the conductive terminal assembly are electrically connected with each other via a flexible connection member.

8 Claims, 13 Drawing Sheets

Fig. 2
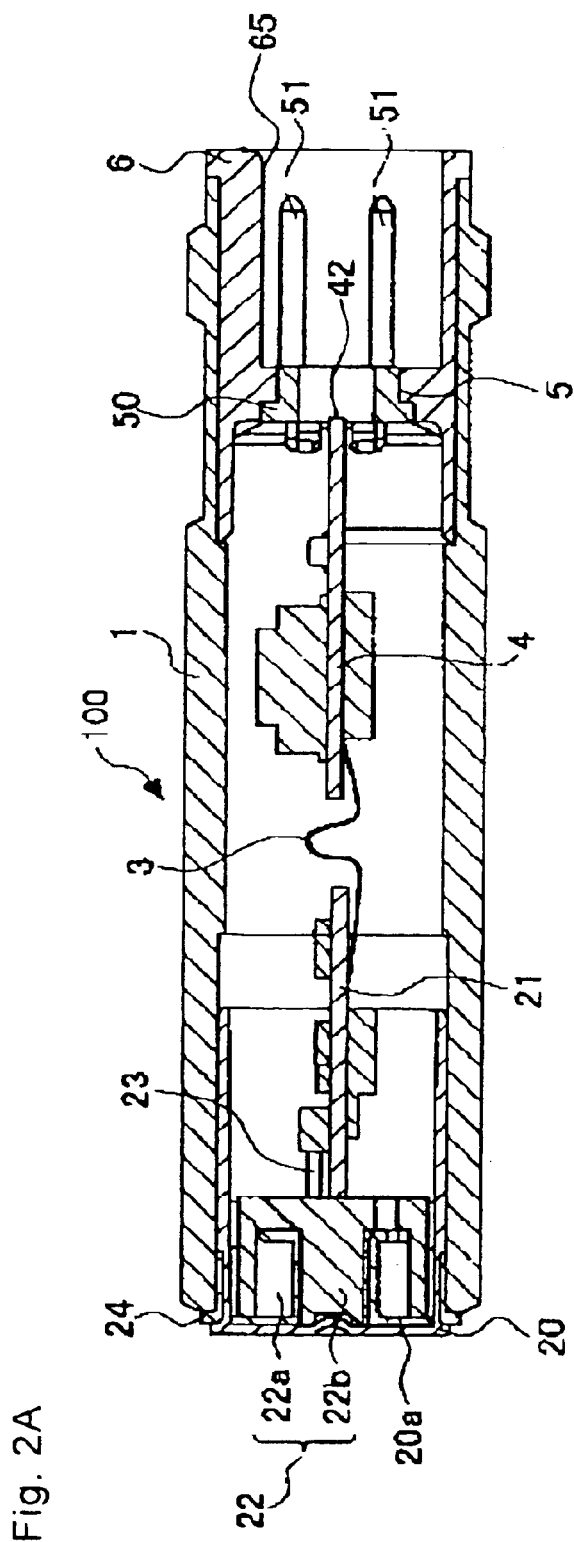
Fig. 2A
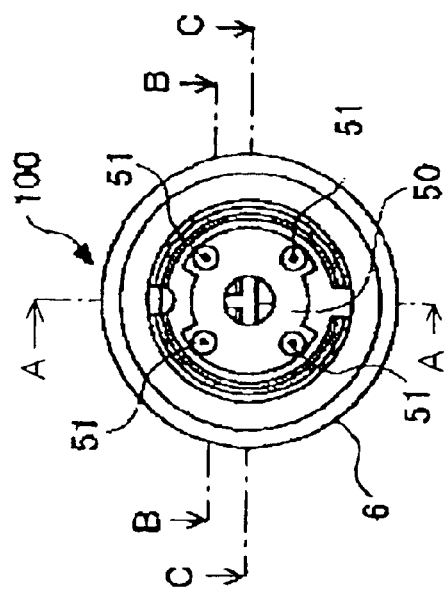
Fig. 2B

PROXIMITY SENSOR

BACKGROUND OF THE INVENTION

1. Field of the Invention

The present invention relates to a proximity sensor comprising: a detection coil assembly including a coil and a core; a circuit assembly incorporating an oscillation circuit having a coil as a resonant circuit element and an output circuit for generating an output signal based on an oscillation state of the oscillation circuit; a plug-adaptable connector; and a cylindrical outer shell case for accommodating all of these components integrally connected with each other.

2. Description of the Related Art

Aproximity sensor employing a flexible spring tongue piece for the electrical connection between a circuit assembly and a connector has been known as one kind of proximity sensor comprising: a detection coil assembly including a coil and a core; a circuit assembly incorporating an oscillation circuit using the coil as a resonant circuit element and an output circuit for generating an output signal based on the oscillating condition of the oscillation circuit; and a connector, all of which are integrally connected with each other and accommodated in a cylindrical outer shell case.

To be more specific, in this proximity sensor, the printed circuit board (corresponding to the circuit assembly) is provided on both sides with terminal parts for the electrical connection with the connector, and is also provided on the connector side with a spring tongue piece which leads to the conductive terminal projecting from the plug outlet and which comes into contact with the terminal parts on the circuit board by sandwiching the printed circuit board.

This proximity sensor can establish electrical connection between the printed circuit board and the connector only by inserting the connector from the rear-end side of the outer shell case into which the printed circuit board has been fitted (see Japanese Unexamined Patent Publication No. 5-144524 (1993)).

The present applicant has suggested in a prior application (Japanese Unexamined Patent Application No. 2001-75117) a proximity sensor employing a flexible connection member as an electrical connection member for its components; a detection coil assembly including a coil and a core; and a circuit assembly incorporating an oscillation circuit using the coil as a resonant circuit element and an output circuit for generating an output signal based on the oscillating condition of the oscillation circuit, which are integrally connected with each other and accommodated in a cylindrical outer shell case.

In this proximity sensor, the circuit assembly comprises a detection circuit-equipped board (detection circuit assembly) containing a detection circuit that includes an oscillation circuit which uses the coil of the detection coil assembly as a resonant circuit element and that generates an object detection signal according to the oscillating condition of the oscillation circuit, and an output circuit-equipped board (output circuit assembly) containing an output circuit which drives an output element based on the object detection signal. This detection circuit assembly and the output circuit assembly are coupled with each other by a flexible connection member so as to make the distance from the detection coil assembly to the output circuit assembly variable, thereby enabling the same sensor main components (a detection coil assembly, a detection circuit assembly, an output circuit assembly, and other components integrally coupled) to be fixed into various outer shell cases of different lengths.

SUMMARY OF THE INVENTION

The present invention has been contrived under the aforementioned situation, and an object thereof is to provide a proximity sensor with improved assembly performance which comprises a detection coil assembly including a coil and a core; a circuit assembly incorporating an oscillation circuit using the coil as a resonant circuit element and an output circuit for generating an output signal based on the oscillating condition of the oscillation circuit; a plug-adaptable connector; and a cylindrical outer shell case for accommodating all of these components integrally connected with each other.

Another object of the present invention is to provide a method for manufacturing such a proximity sensor.

Further another object and effects of the present invention will be easily understood by the person skilled in the art by referring to the following description.

The proximity sensor of the present invention is predicated on a proximity sensor comprising: a cylindrical outer shell case; a detection coil assembly which includes a coil and a core and which is fitted to a front-end side of the outer shell case; a plug-adaptable connector which is fitted to a rear-end side of the outer shell case; and a circuit assembly which is disposed between the detection coil assembly and the connector and which incorporates an oscillation circuit using the coil as a resonant circuit element and an output circuit for generating an output signal based on the oscillating condition of the oscillation circuit.

In the proximity sensor of the present invention, the connector includes a conductive terminal assembly and a holding member.

The conductive terminal assembly includes a plug-adaptable conductive terminal to be electrically connected with the circuit assembly and a pin holder for holding this conductive terminal, and is sized to be able to be inserted from the front-end side of the outer shell case. Herein, "the plug-adaptable conductive terminal" indicates that the conductive terminal is adaptable to the plug with which it is connected, and its shape and material do not matter. The phrase "to be inserted from the front-end side of the outer shell case" indicates that in assembling the sensor, the conductive terminal assembly is inserted from the front-end side of the outer shell case and is positioned and fixed inside the outer shell case. It goes without saying that this does not mean that the conductive terminal assembly can be partly inserted into the outer shell case.

The holding member is a cylinder with openings at both ends. This holding member lets the conductive terminal assembly be inserted therein, and includes a joint part inside to position the conductive terminal assembly thereto. The holding member is integrated with the outer shell case by being press-fitted from the rear-end side of the outer shell case. Preferably, a pin holder is press-fitted into the "joint part", there by making the conductive terminal assembly be fixed (positioned) to the holding member. The joint part can be realized by employing snap fit or another fixing structure; however, it can be also realized by a comparatively simple structure by positioning the conductive terminal assembly by press-fitting the pin holder.

The proximity sensor of the present invention has another feature of electrically connecting the detection coil assembly and the conductive terminal assembly by providing a flexible connection member therebetween. This indicates that the proximity sensor of the present invention can be manufactured through the following steps (a) to (d) shown below, for example. This method for manufacturing the proximity sensor is nothing but an example and is not the only manufacture method of the proximity sensor of the present invention available.

(a) A step of preparing a yet-to-be-completed product including: a detection coil assembly which includes a coil and a core; a circuit assembly which incorporates an oscillation circuit using the coil as a resonant circuit element and an output circuit for generating an output signal based on the oscillating condition of the oscillation circuit; and a conductive terminal assembly including a plug-adaptable conductive terminal held by a pin holder; the detection coil assembly, the circuit assembly and the conductive terminal assembly being electrically connected in this order by disposing at least one flexible connection member in the yet-to-be-completed product; a cylindrical holding member which has openings at both ends so as to enable the conductive terminal assembly to be inserted and which also has a joint part inside to enable the conductive terminal assembly to be positioned to the holding member, and a cylindrical outer shell case for integrally accommodating the yet-to-be-completed product and the holding member;

(b) a step of inserting the yet-to-be-completed product from a front-end side of the outer shell case from the conductive terminal assembly side and press-fitting the detection coil assembly to the front-end side of the outer shell case;

(c) a step of press-fitting the holding member to a rear-end side of the outer shell case; and (d) a step of fixing the conductive terminal assembly to the joint part of the holding member by moving the pin holder of the conductive terminal assembly inside the outer shell case through the openings of the holding member.

The proximity sensor of the present invention electrically connects the detection coil assembly and the conductive terminal assembly by (as a bridge) disposing a flexible connection member therebetween. Therefore, in its manufacturing process, even when a yet-to-be-completed product is inserted from the front-end side of the outer shell case and the detection coil assembly is fixed to the front-end side of the outer shell case, at this stage, the relative position of the conductive terminal relative to the outer shell case is not determined, which allows the conductive terminal to be positioned comparatively freely according to the length of the connection member. This means that the conductive terminal can be easily positioned and fixed relative to the holding member fixed (positioned) at the rear-end side of the outer shell case, which facilitates assembling.

In contrast, if the yet-to-be-completed product is fixedly coupled without disposing a flexible connection member, the position of the conductive terminal relative to the outer shell case is determined at the point when the detection coil assembly is fixed on the front-end side of the outer shell case. This means that the holding member is fixed to the already positioned conductive terminal, which makes it extremely difficult to fix the holding member unless the conductive terminal is positioned in pretty high precision at this point. Therefore, in this case, the yet-to-be-completed product is likely to have too much stress during the fixing of the holding member, which may cause problems such as more frequent failures.

The proximity sensor of the present invention can be also manufactured by the steps shown in the following (a) to (g):

(a) a step of preparing a yet-to-be-completed product including: a detection coil assembly which includes a coil and a core; a circuit assembly which incorporates an oscillation circuit using the coil as a resonant circuit element and an output circuit for generating an output signal based on the oscillating condition of the oscillation circuit; and a conductive terminal assembly which includes a plug-adaptable conductive terminal, a pin holder which holds the conductive terminal and is equipped with a through hole, and a pipe integral with the pin holder via a joint part that can be cut easily and forming a resin flow path together with the through hole; the detection coil assembly, the circuit assembly and the conductive terminal assembly being electrically connected in this order by disposing at least one flexible connection member somewhere in the yet-to-be-completed product; a cylindrical holding member which has openings at both ends so as to enable the conductive terminal assembly to be inserted and which also has a joint part inside so as to enable the conductive terminal assembly to be positioned to the holding member; and a cylindrical outer shell case for integrally accommodating the yet-to-be-completed product and the holding member;

(b) a step of inserting the yet-to-be-completed product from a front-end side of the outer shell case from the conductive terminal assembly side and press-fitting the detection coil assembly to the front-end side of the outer shell case;

(c) a step of drawing the pipe of the conductive terminal assembly from the outer shell case and inserting into the holding member;

(d) a step of press-fitting the holding member to a rear-end side of the outer shell case;

(e) a step of fixing the conductive terminal assembly to the joint part of the holding member by manipulating the pipe inserted into the holding member;

(f) a step of filling resin into the outer shell case through the pipe; and (g) a step of detaching the pipe from the conductive terminal assembly.

In this manufacturing method, a pipe enables the pin holder and the holding member to be fixed easily and accurately, and also enables resin filling by using its hollow part, thereby obtaining a completed product of proximity sensor efficiently.

The proximity sensor of the present invention can comprise a circuit assembly from two circuit-equipped boards. In this case, a flexible connection member can be disposed between the two circuit-equipped boards. In a specific embodiment, the circuit assembly comprises a detection circuit-equipped board containing a detection circuit that includes an oscillation circuit which uses the coil of the detection coil assembly as a resonant circuit element and that generates an object detection signal according to the oscillating condition of the oscillation circuit, and an output circuit-equipped board containing an output circuit which drives an output element based on the object detection signal. The detection circuit-equipped board is supported by and electrically connected with the detection coil assembly, the output circuit-equipped board is supported by and electrically connected with the conductive terminal assembly, and the detection circuit-equipped board and the output circuit-equipped board are electrically connected with each other by disposing the flexible connection member as a bridge between them.

Such a structure enables the detection circuit-equipped board and the output circuit-equipped board to be manufactured as separate components from each other, so that various types of proximity sensors of different performances can be obtained by appropriately combining detection circuit-equipped boards of different specifications and output circuit-equipped boards of different specifications.

The proximity sensor of the present invention including the circuit assembly comprising the two circuit-equipped boards can be manufactured through the steps shown in the following (a) to (d):

(a) a step of preparing a yet-to-be-completed product including: a detection coil assembly which includes a coil and a core; a circuit assembly which includes a detection circuit board containing an oscillation circuit using the coil as a resonant circuit element and a detection circuit for generating an object detection output signal according to the oscillating condition of the oscillation circuit, and an output circuit board containing an output circuit for driving an output element based on the object detection output signal, the detection circuit board and the output circuit board being electrically connected with each other by a flexible connection part disposed therebetween; and a conductive terminal assembly including a plug-adaptable conductive terminal held by a pin holder; the detection coil assembly, the circuit assembly and the conductive terminal assembly being electrically connected with each other; a cylindrical holding member which has openings at both ends so as to enable the conductive terminal assembly to be inserted and which also has a joint part inside to enable the conductive terminal assembly to be positioned to the holding member; and a cylindrical outer shell case for integrally accommodating the yet-to-be-completed product and the holding member;

(b) a step of inserting the yet-to-be-completed product from a front-end side of the outer shell case from the conductive terminal assembly side and press-fitting the detection coil assembly to the front-end side of the outer shell case;

(c) a step of press-fitting the holding member to a rear-end side of the outer shell case; and (d) a step of fixing the conductive terminal assembly to the joint part of the holding member by moving the pin holder of the conductive terminal assembly inside the outer shell case through the openings of the holding member.

Alternatively, the proximity sensor can be manufactured through the steps shown in the following (a) to (g):

(a) a step of preparing a yet-to-be-completed product including: a detection coil assembly which includes a coil and a core; a circuit assembly which includes a detection circuit board containing an oscillation circuit using the coil as a resonant circuit element and a detection circuit for generating an object detection output signal according to the oscillating condition of the oscillation circuit, and an output circuit board containing an output circuit for driving an output element based on the object detection output signal, the detection circuit board and the output circuit board being electrically connected with each other by a flexible connection part disposed therebetween; and a conductive terminal assembly which includes a plug-adaptable conductive terminal, a pin holder which holds the conductive terminal and is equipped with a through hole, and a pipe integral with the pin holder via a joint part that can be cut easily and forming a resin flow path together with the through hole; the detection coil assembly, the circuit assembly and the conductive terminal assembly being electrically connected in this order; a cylindrical holding member which has openings at both ends so as to enable the conductive terminal assembly to be inserted and which also has a joint part inside so as to enable the conductive terminal assembly to be positioned to the holding member; and a cylindrical outer shell case for integrally accommodating the yet-to-be-completed product and the holding member;

(b) a step of inserting the yet-to-be-completed product from a front-end side of the outer shell case from the conductive terminal assembly side and press-fitting the detection coil assembly to the front-end side of the outer shell case;

(c) a step of drawing the pipe of the conductive terminal assembly from the outer shell case and inserting into the holding member;

(d) a step of press-fitting the holding member to a rear-end side of the outer shell case;

(e) a step of fixing the conductive terminal assembly to the joint part of the holding member by manipulating the pipe inserted into the holding member;

(f) a step of filling resin into the outer shell case through the pipe; and (g) a step of detaching the pipe from the conductive terminal assembly.

As apparent from the above description, the main feature of the proximity sensor of the present invention is the connector comprising the conductive terminal assembly and the holding member. This connector can be expressed as a connector which integrates a terminal assembly including a pin holder for holding the plug-adaptable conductive terminal with a cylindrical holding member which has openings on both ends and lets the conductive terminal assembly be inserted therein from one of the openings, and which also includes a joint part inside for positioning the conductive terminal assembly to the holding member. Such a connector can be applied to various types of outer shell cases of different outer diameters designed so as to make the holding member be fitted from the rear-end side and the conductive terminal assembly be inserted therein from the front-end side to be joined with the holding member.

BRIEF DESCRIPTION OF THE DRAWINGS

FIG. 2A is a cross sectional view of the proximity sensor of FIG. 1 in the assembled condition, taken along the line A—A shown in FIG. 2B, and FIG. 2B is a rear view of the same proximity sensor;

DESCRIPTION OF THE PREFERRED EMBODIMENTS

A preferable embodiment of the proximity sensor according to the present invention will be described in detail, with reference to the attached drawings as follows. The following embodiment is nothing but one example of the present invention and it goes without saying that the gist of the present invention is defined only by the scope of the claims.

Figure 1:
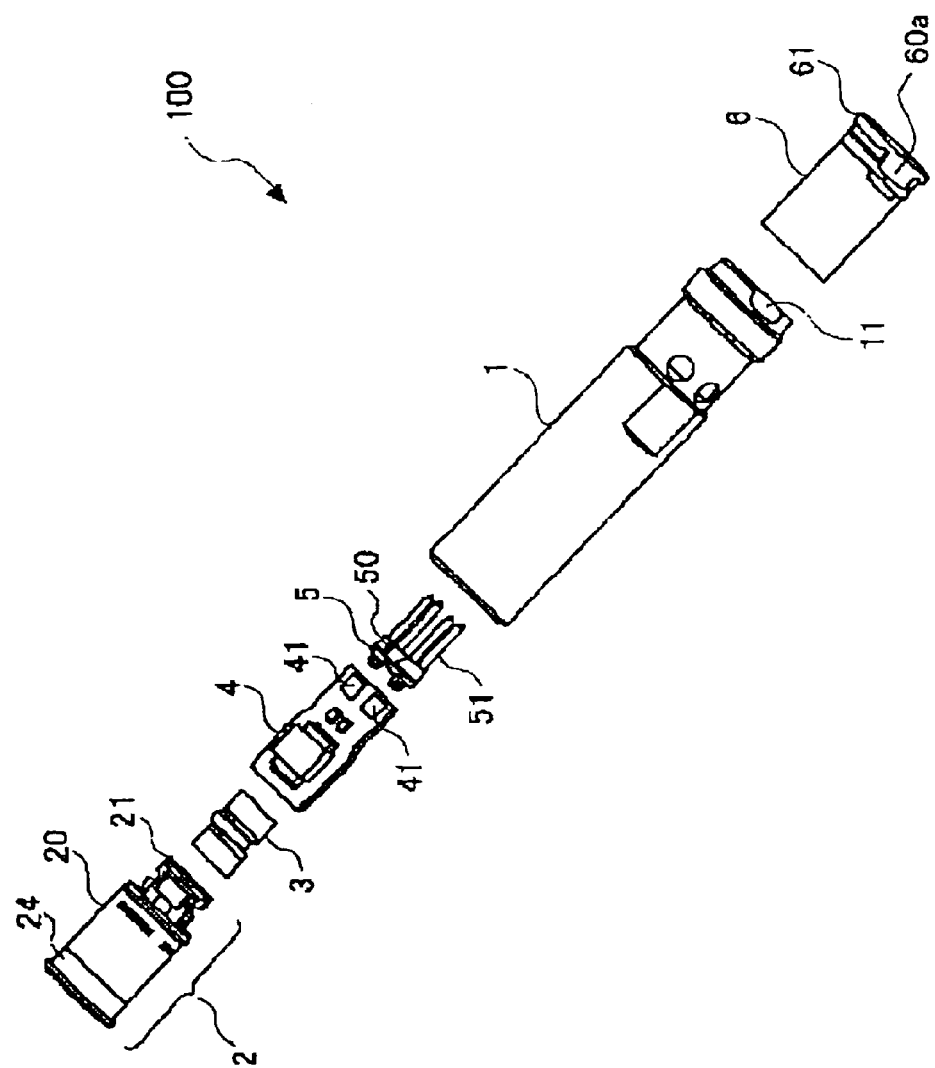
FIG. 1 is an exploded perspective view showing the structure of the proximity sensor of the first embodiment.
Figure 3:
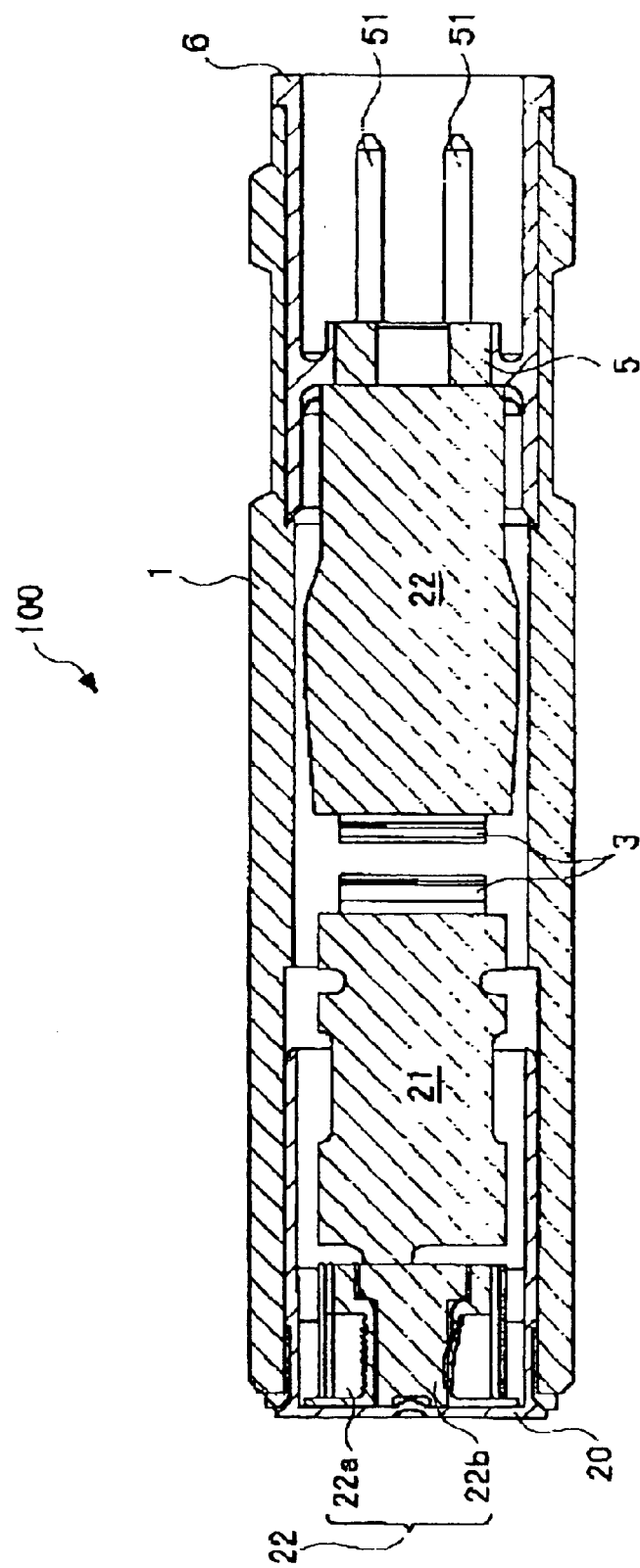
FIG. 3 is a cross sectional view of the proximity sensor taken along the line B—B of FIG. 2B.
Figure 4:
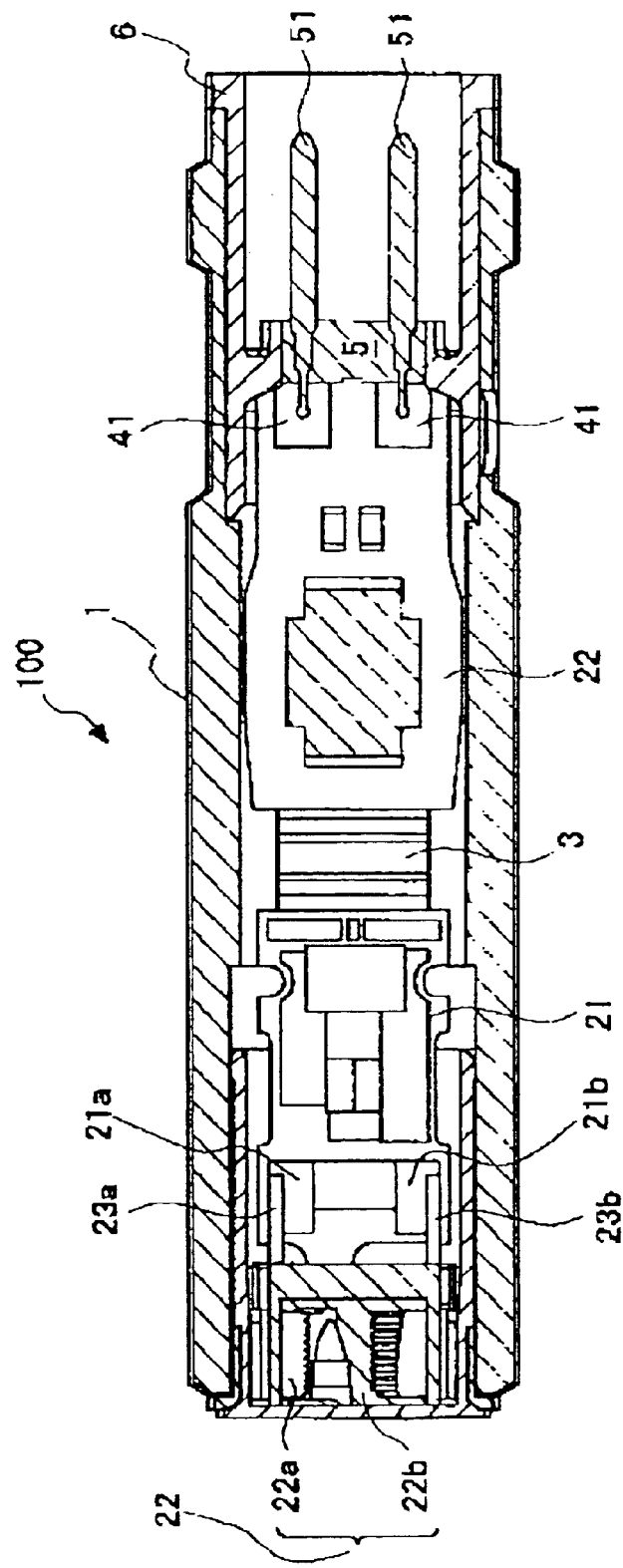
FIG. 4 is a cross sectional view of the proximity sensor taken along the line C—C of FIG. 2B.

The overall structure of the proximity sensor of the present embodiment is illustrated in the exploded perspective view of FIG. 1 and the cross sectional view of each of FIGS. 2 to 4. FIG. 2A is a cross sectional view taken along the line A—A shown in FIG. 2B when the proximity sensor 100 has been assembled, and FIG. 2B shows a rear view (the appearance seen from behind the sensor) of the proximity sensor 100. FIG. 3 is a cross sectional view of the proximity sensor 100 taken along the line B—B shown in FIG. 2B, and FIG. 4 is a cross sectional view of the proximity sensor 100 taken along the line C—C shown in FIG. 2B.

As shown in FIG. 1, the proximity sensor 100 of the present embodiment comprises a detection end module 2, a connection member 3, an output circuit assembly 4, a terminal pin assembly 5 and a receptacle (holding member) 6 which compose a connector, and a metallic cylindrical outer shell case 1 accommodating all these components.

The detection end module 2, as shown in FIGS. 2 to 4, comprises a detection coil assembly 22 including a coil (coil spool) 22a and a ferrite core 22b, a detection circuit assembly 21 electrically connected with the detection coil assembly 22, and a cylindrical coil case 20 with a bottom which accommodates these members.

The coil spool 22a of the detection coil assembly 22 includes a pair of metallic terminal pieces 23a, 23b (See FIG. 4). The detection circuit assembly 21 is a detection circuit-equipped board which contains on its rectangular board a detection circuit that includes an oscillation circuit using the coil 21a as a resonant circuit element and that generates an object detection signal with a fixed form in accordance with the oscillating condition of the oscillation circuit. The metallic terminal pieces 23a, 23b of the detection coil assembly 22 are soldered to the terminal parts 21a, 21b, respectively, shown in FIG. 4, thereby being supported by and electrically connected with the detection circuit assembly.

The detection end module 2 is thus structured and is press-fitted into the front-end part of the outer shell case 1 via the coil case 20.

The reference numeral 24 in the drawing represents a mask member press-fitted around the front part of the coil case 20. In this case, the provision of the mask member 24 realizes a detection end module whose detection properties are not affected very much (property concluded) by the presence or absence of the outer shell case 1. This property conclusion will not be explained in detail here because it is not directly related to the gist of the present invention.

The connection member 3 is a harness with a variable connection length (flexible board) comprising a polyimide base material and a necessary number of parallel wires for electrically connecting the detection circuit assembly 21 and the output circuit assembly 4 arranged on the base material. The connection member 3, in this case, electrically connects between the detection circuit assembly 21 and the output circuit assembly 4 by letting both edges be heat-pressed to unillustrated terminal patterns provided in the detection circuit assembly 21 and the output circuit assembly 4 by either soldering or using a conductive adhesive, thereby enabling the supply and reception of electric power and the input and output of the object detection signal between the detection circuit assembly 21 and the output circuit assembly 4.

Then, the output circuit assembly 4 is an output circuit-equipped board comprising an output circuit which drives an output element based on the object detection signal coming from the detection circuit assembly 21 via the connection member 3 and a rectangular board which contains the output circuit. To be more specific, the output circuit assembly incorporates a logical circuit, an output control circuit, and an output transistor, and is designed so as to make the logical circuit logically process the entered object detection signal, and then to make the output control circuit operate output transistors, thereby allowing a signal of the desired form based on the object detection signal to be outputted from the terminal pin assembly 5 described below to outside. The reference numeral 41 shown in FIG. 1 or 4 represents terminal patterns to which the terminal pins of the terminal pin assembly 5 are soldered. Although it is not specified in the drawing, two terminal patterns are provided on each of the front and back sides in accordance with the number of terminal pins of the terminal pin assembly 5 (four in this case).

The connector, which is the main part of the present invention, will be described step by step as follows. The connector applied to the proximity sensor of the present invention comprises the terminal pin assembly 5 and the receptacle 6 as shown in FIGS. 1 to 4.

Figure 5:
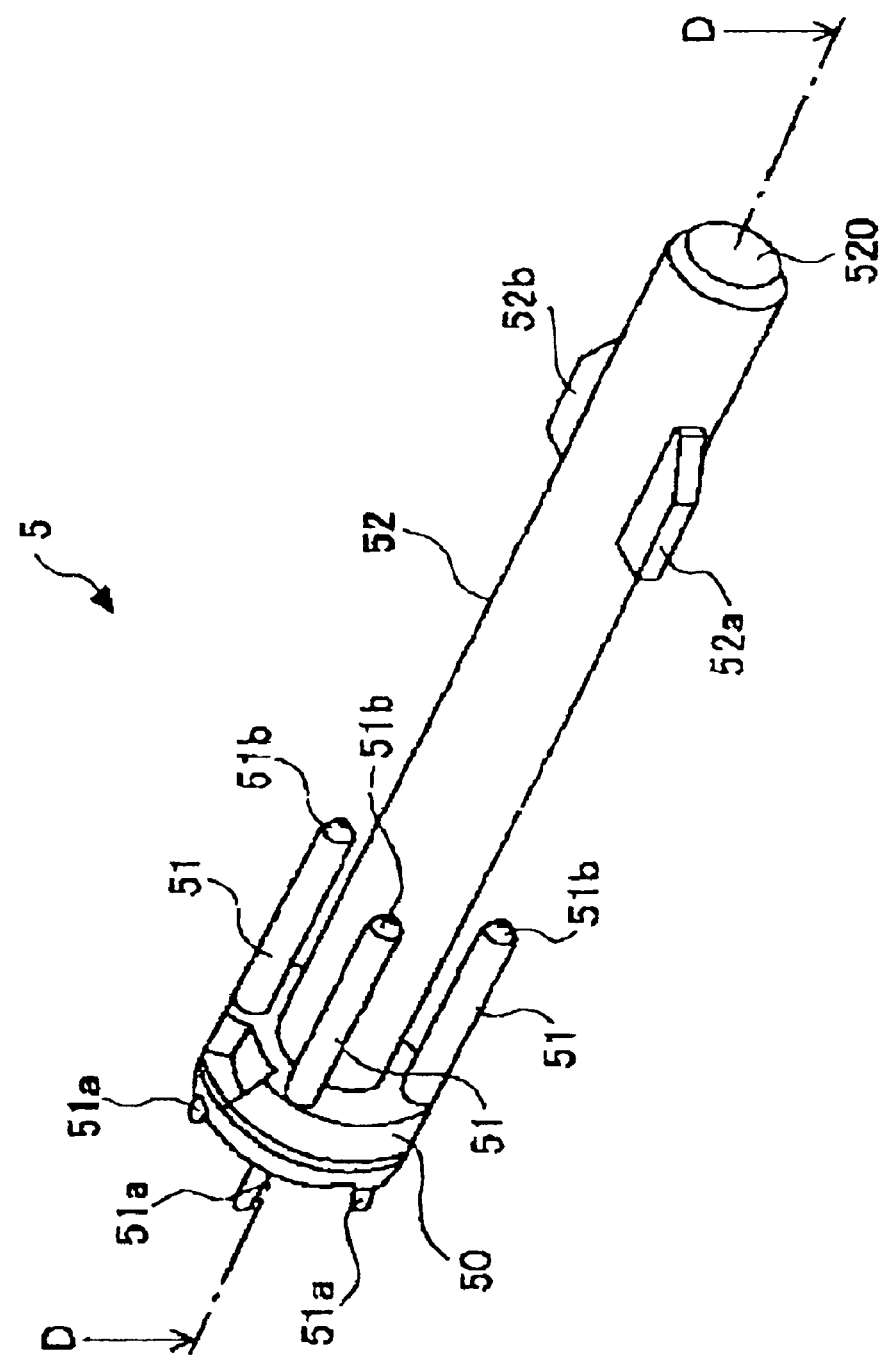
FIG. 5 is an overall perspective view showing the structure of the terminal pin assembly (with a pipe)
Figure 6A:
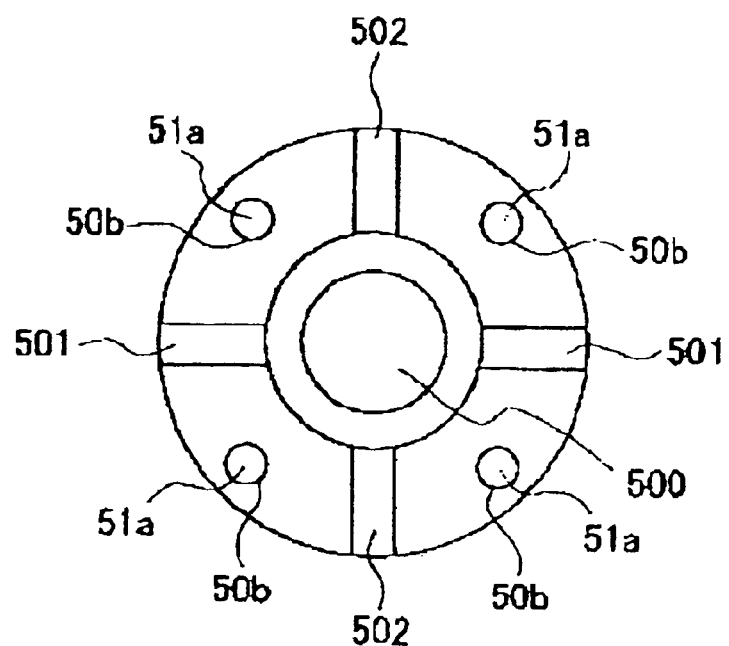
FIGS. 6A and 6B show the front-end surface and the rear-end surface of the terminal pin assembly (with a pipe)
Figure 6B:
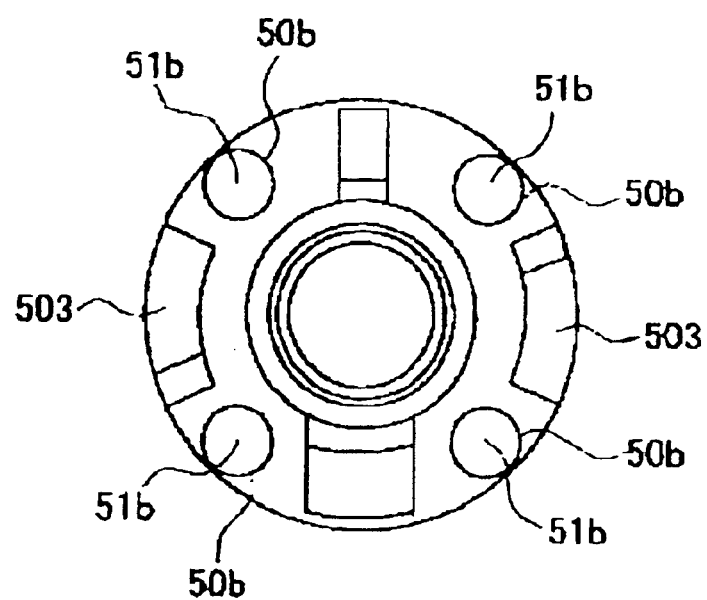
Figure 7:
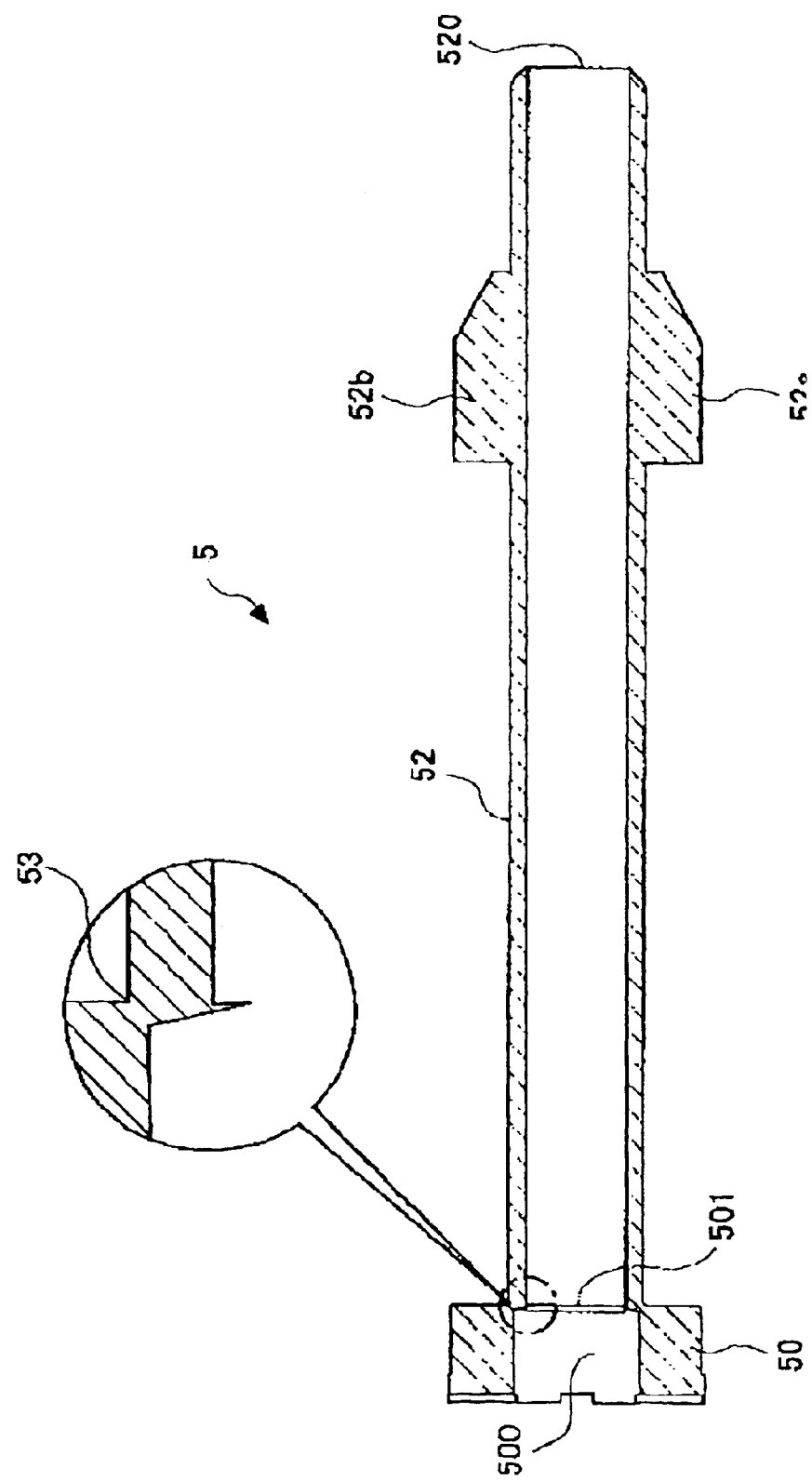
FIG. 7 is a cross sectional view of the terminal pin assembly with a pipe taken along the line D—D of FIG. 5.

The terminal pin assembly is detailed in the overall perspective view of FIG. 5, the plan views of FIGS. 6A and 6B, and the cross sectional view of FIG. 7. FIGS. 5 to 7 show the terminal pin assembly 5 with a pipe, which will be detached as described later. FIG. 6A shows the appearance of the front-end surface (the surface facing the output circuit assembly 4) of the terminal pin assembly 5 with a pipe; FIG. 6B shows the appearance of the rear-end surface (the surface facing the receptacle 6) of the terminal pin assembly 5 with a pipe; and FIG. 7 shows a cross sectional view taken along the line D—D of FIG. 5 showing the terminal pin assembly 5 with a pipe.

As shown in FIG. 1, the terminal pin assembly 5 includes four terminal pins 51 of the same shape which are inserted to the pin holder 50. The terminal pin assembly 5 shown in FIGS. 5 to 7 is in the condition before the pipe is detached as described later, and in the condition the pipe 52 is integrated with the pin holder 50 having a through hole 500 at the center (See FIG. 7) and terminal pin through holes 50b arranged around the through hole 500. The pin holder 50 and the pipe 52 are manufactured as an integral resin product.

As shown in FIG. 6A, on the front-end surface of the pin holder 50 are provided two pairs of engagement trenches 501—501, 502—502 aligned in the vertical direction and in the horizontal direction, respectively. In assembling the sensor, the side edge of the board 42 (See FIG. 2) of the output circuit assembly 4 is engaged into either one of the pairs of engagement trenches (501—501 or 502—502), thereby roughly positioning the pin holder 50 (terminal pin assembly 5) relative to the output circuit assembly 4. Later, as will be described below, the terminal pin 51 is soldered to the output circuit assembly 4, thereby fixing the terminal pin assembly 5 to the output circuit assembly.

As shown in FIG. 6B, on the rear-end surface of the pin holder 50 are provided a pair of cuttings 503—503 which function as a joint part with the receptacle 6 which will be detailed later.

As shown in FIG. 7, the pipe 52 is connected with the through hole 500 of the pin holder 50, and has a through hole (hollow part) 520 which forms a resin flow path at the time of filling resin that will be described later, and also a pair of projecting pieces 52a–52b on the outer surface. As shown in the magnified view of FIG. 7, the junction 53 between the pin holder 50 and the pipe 52 is thin-walled, so that the pipe 52 can be easily detached from the pin holder 50 by rotating (twisting) the pipe 52 around the axis while holding the projecting pieces 52a–52b in the condition that the pin holder 50 is fixed.

The four terminal pins 51, which electrically connect between an unillustrated outer plug to be connected with the connector and the output circuit assembly 5, are arranged parallel to each other by the pin holder 50. In this case, the connection end parts 51a for the detection circuit assembly 5 are made slightly slimmer than the connection end parts 51b for the outer plug, and a step part (not illustrated) is provided between them so as to prevent the terminal pins from coming off while the terminal pin assembly 5 is being assembled by inserting the terminal pins 51 into the holder 50. The connection end parts 51a of the terminal pins 51 are soldered to the terminal parts 41 of the output circuit assembly 4 described earlier, thereby establishing electric connection between the output circuit assembly 4 and the terminal pin assembly 5.

Figure 8:
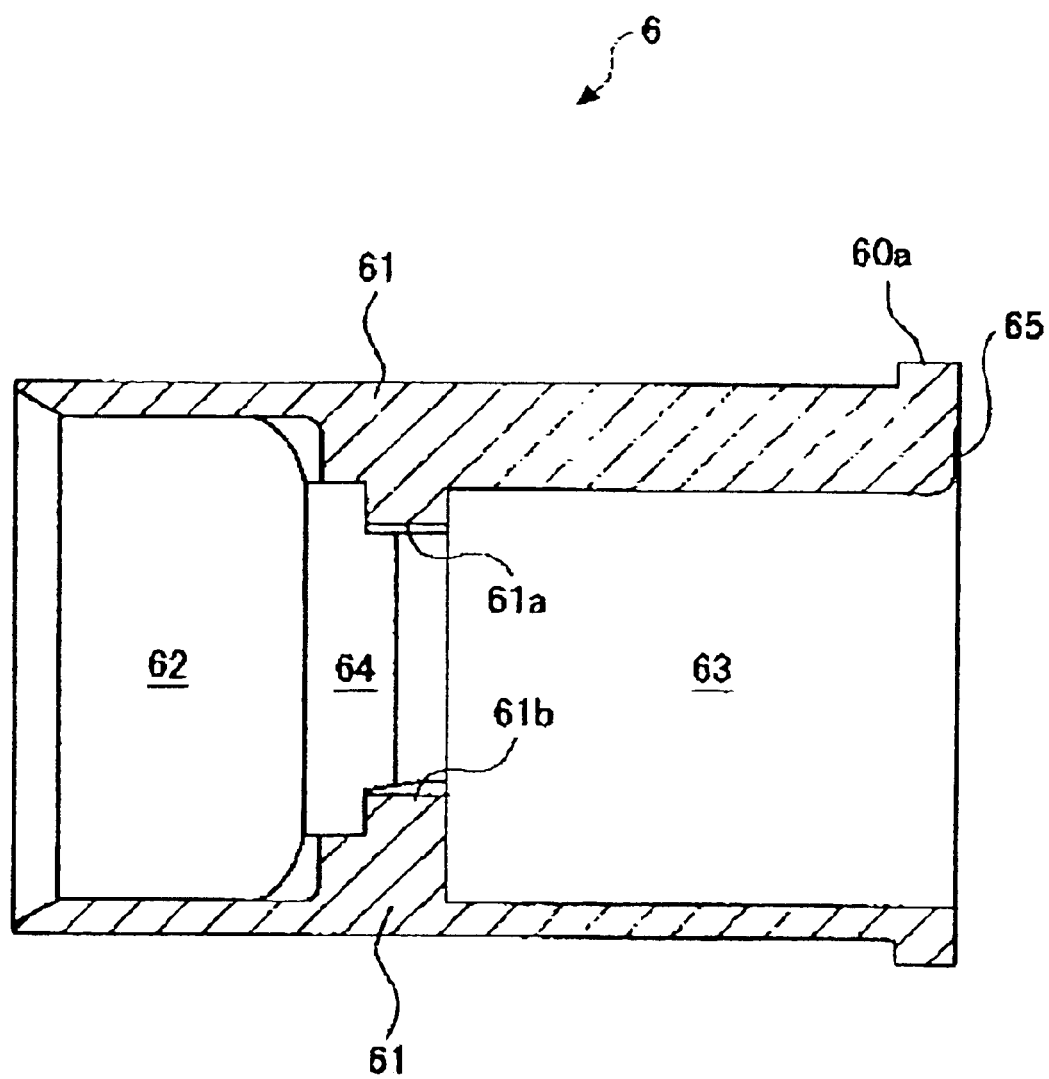
FIG. 8 is a cross sectional view showing the structure of the receptacle.
Figure 9A:
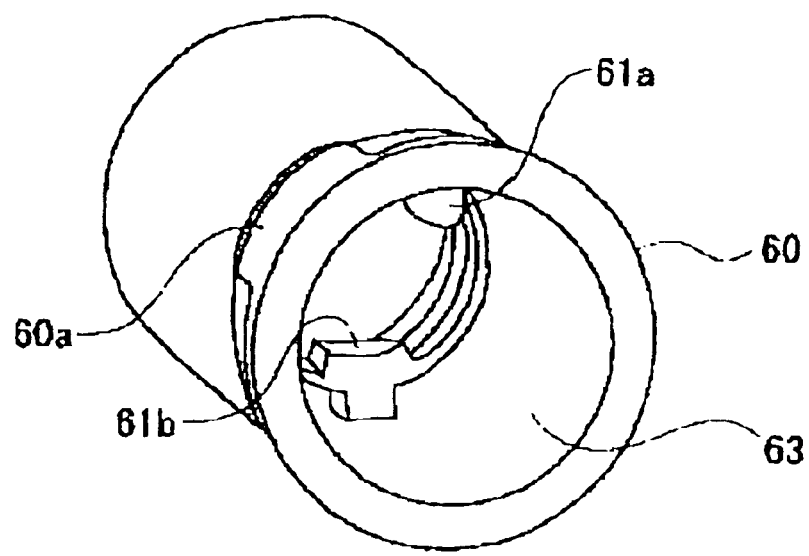
FIGS. 9A and 9B shows the appearances of the receptacle seen from diagonally behind and seen from diagonally ahead.
Figure 9B:
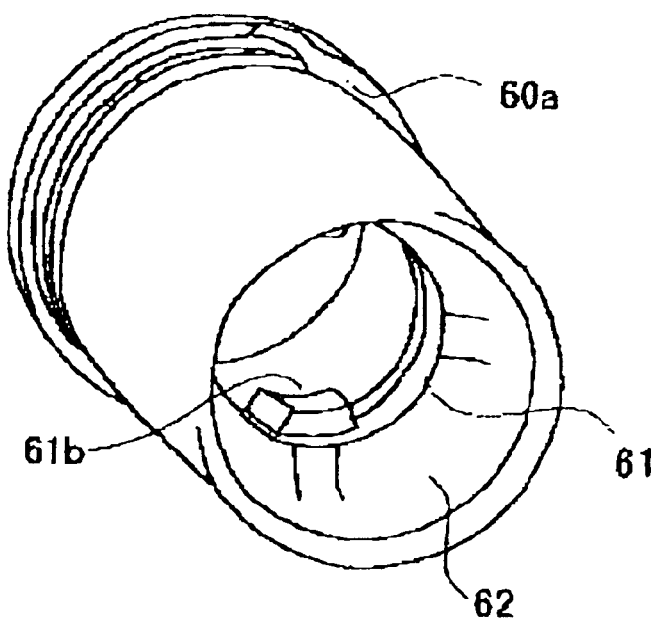
Figure 10A:
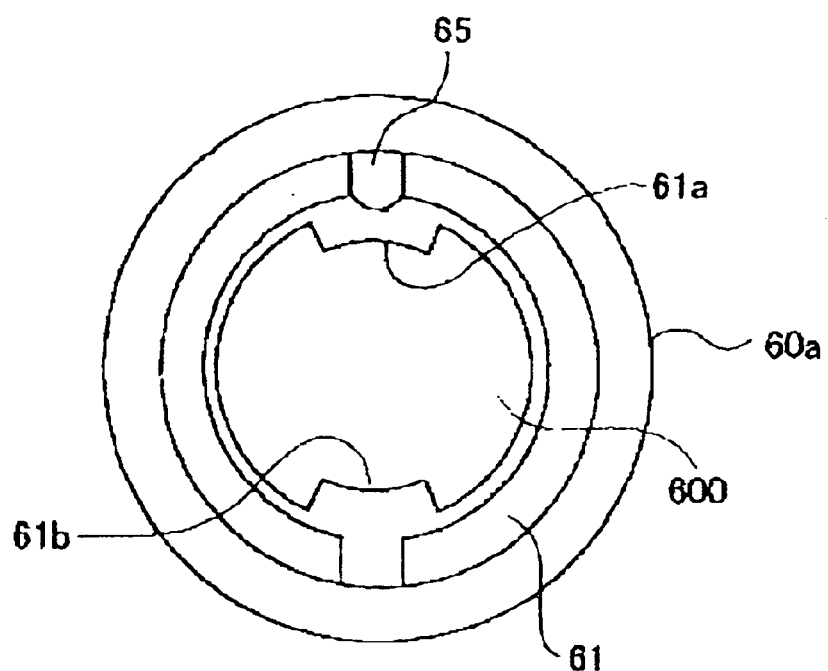
FIGS. 10A and 10B show the appearances of the receptacle seen from behind and seen from ahead.
Figure 10B:
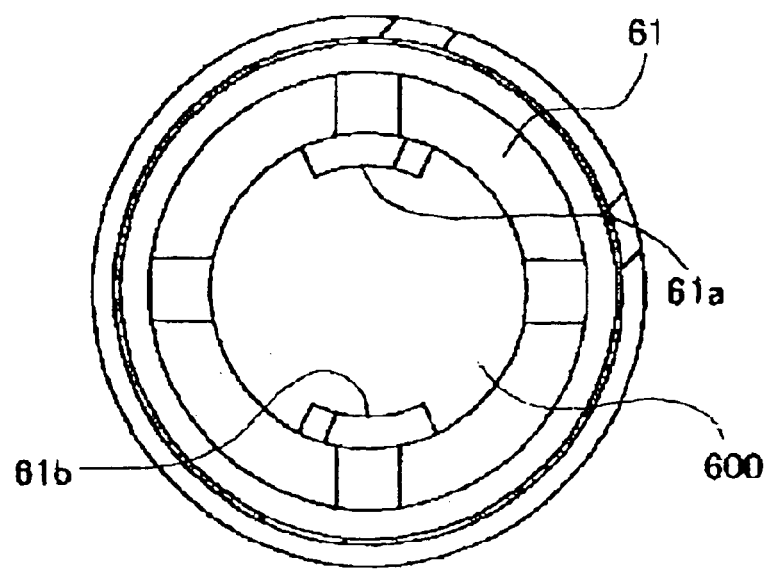

The receptacle is detailed in the cross sectional view of FIG. 8, the perspective views of FIGS. 9A and 9B, and the plan views of FIGS. 10A and 10B. FIG. 8 shows a magnified view of the receptacle shown in FIG. 1; FIG. 9A shows the appearance of the receptacle seen from diagonally behind; FIG. 6B shows the appearance of the receptacle 6 seen from diagonally ahead; FIG. 10A shows the front view of the receptacle seen from behind; and FIG. 10B shows the front view of the receptacle seen from ahead.

The receptacle 6 is a cylindrical member having a guard part 60 around its back part, and is press-fitted into the rear-end part of the outer shell case 1 so as to support the outer plug and the terminal pin assembly 5 in the outer shell case 1. Part of the guide part 60 forms an engagement part 60a to be engaged into the cutting 11 (See FIG. 1) formed at the rear-end part of the outer shell case 1 when press-fitted into the outer shell case 1. The engagement part 60a is used to position the receptacle 6 relative to the outer shell case when press-fitted. The receptacle 6 further includes a swelling part 61 formed around the inner surface in the center, and the space enclosed by the inner surface of the swelling part 61 forms an accommodation space 64 (See FIG. 8) as the joint part to which the pin holder is press-fitted. To be more specific, the swelling part 61 is formed in such a manner that the inner diameter of the accommodation space 64 is nearly the same as the outer diameter of the terminal holder 50. In addition, a pair of protruding pieces 61a, 61b facing each other is provided on the inner surface of the swelling part 61. Engaging the protruding pieces 61a, 61b into the cuttings 503, 503 of the pin holder 50 and at the same time press-fitting the pin holder 50 into the accommodation space 64 can integrate the pin holder 50 (terminal pin assembly 4) with the receptacle 6 (see FIG. 1).

The internal hollow of the receptacle 6 is divided into the front hollow 62 and the rear hollow 63 with the swelling part 61 (accommodation space 64) therebetween. The rear hollow 63 forms a plug outlet where the terminal pins 51 of the terminal pin assembly 4 are arranged (see FIG. 1). The reference numeral 65 shown in FIGS. 8 to 10 represents a rail-shaped projecting part which prevents the plug inserted into the plug outlet 63 from rotating around the axis and which is engaged into prescribed trenches provided at an unillustrated plug. The details will be omitted.

Figure 11:
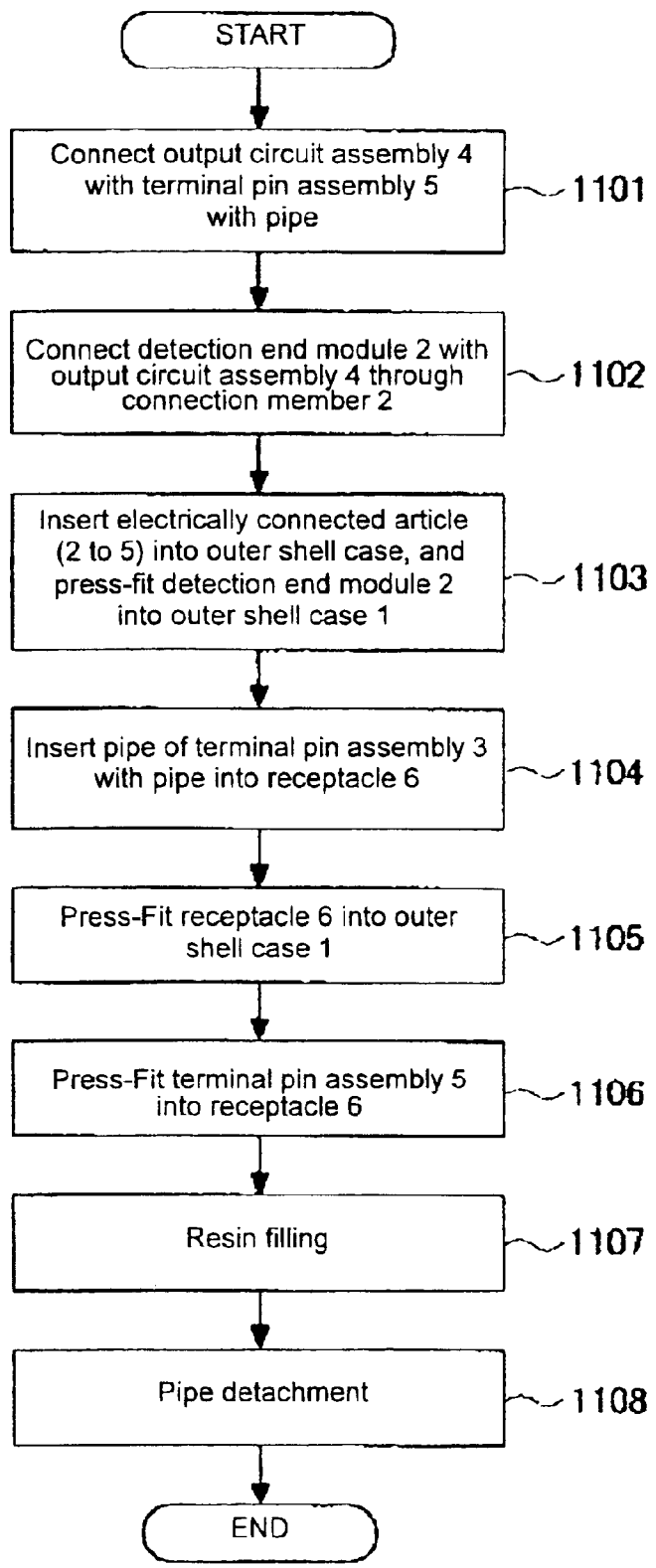
FIG. 11 is a flowchart depicting a method for manufacturing (an assembly procedure of) the proximity sensor of the present embodiment.

The procedure of assembling the proximity sensor of the present embodiment is shown in the flowchart of FIG. 11.

As shown in the flowchart, in the present embodiment, first of all, the output circuit assembly 4 and the terminal pin assembly 5 (with pipe) are electrically connected to each other (step 1101). In this process, as described earlier, the side edge (see Fig.2) of the board 42 of the output circuit assembly 4 is engaged into the pair engagement trenches (501—501 or 502—502 (see FIG. 6)) formed in the pin holder 50, thereby roughly positioning the pin holder 50 (terminal pin assembly 5) relative to the output circuit assembly 4. Later, the connection end parts 51a (see FIG. 5) of the terminal pins 51 are soldered to the respective terminal parts 41 formed in the output circuit assembly 4. As a result, the terminal pin assembly 5 is firmly fixed and electrically connected to the output circuit assembly 4.

Then, the detection end module 2 and the output circuit assembly 4 are connected to each other by using the connection member 3 as a bridge (step 1102). This connection is done by letting both edges of the connection member 3 be heat-pressed to unillustrated terminal patterns provided in the detection circuit assembly 21 and the output circuit assembly 4 by either soldering or using a conductive adhesive. The result is an electrically connected article (a yet-to-be-completed product) including the detection end module 2, the connection member 3, the output circuit module 4, and the terminal pin assembly 5 with a pipe.

The aforementioned electrically connected article is inserted into the outer shell case 1 through the front opening from the terminal pin assembly 5 with a pin, and at the same time the detection end module 2 is press-fitted into the outer shell case 1 to fix the electrically connected article to the outer shell case (step 1103). At this stage, the electrically connected article is merely fixed to the outer shell case 1 on the detection end module side, so that the terminal pin assembly 5 on the other side can be moved to any position relative to the outer shell case 1 within the permissible limits of expansion of the connection member 3.

The pipe 52 of the terminal pin assembly 5 with a pipe is drawn through the rear opening of the outer shell case 1 and is inserted through the front opening of the receptacle 6 (step 1104). As apparent from FIGS. 1 and 7, the whole length of the pipe 52 in the longitudinal direction is about twice the whole length of the receptacle 6 in the longitudinal direction. This enables the projecting pieces 52a–52b of the pipe 52 to be drawn through the rear opening of the receptacle 6 in the condition before the pin holder 50 is press-fitted into the accommodation space 64 of the receptacle 6.

The receptacle 6 is inserted through the rear opening of the outer shell case 1 with the pipe 52 inserted, so as to be press-fitted into the outer shell case 1 (step 1105). As a result, the detection end module 2, the connection member 3, the output circuit assembly 4, the terminal pin assembly 5, and the receptacle 6 are accommodated into the outer shell case 1.

Then, the pipe 52 projecting from the rear opening of the receptacle 6 is manipulated to set the pin holder 50 accommodated in the outer shell case into the accommodation space 40 of the receptacle 6 and to pull, thereby press-fitting the terminal pin assembly 5 into the receptacle 6 (step 1106). The result is a yet-to-be-completed product in which all the sensor components are positioned and fixed relative to the outer shell case 1.

Then, resin is filled into the outer shell case 1 of the yet-to-be-completed product (step 1107). This resin filling is done, as described earlier, by means of the resin flow path formed by the through hole 520 of the pipe 52 and the through hole 500 of the pin holder 50. To be more specific, the nozzle of a funnel-type hopper for pouring resin (not illustrated) comprising a resin container and a resin flow nozzle is inserted into the through hole 520 of the pipe 52, and a prescribed amount of resin is poured into the resin container of the hopper for pouring resin. After this, while the yet-to-be-completed product integral with the hopper is gradually inclined to be shifted to a horizontal condition, the hopper is directed towards the center and turned around the vertical axis. This produces centrifugal force and enables the resin to be flown into the outer shell case 1 through the hopper and the resin flow path of the terminal pin assembly 5 and the air in the outer shell case 1 to be released, thereby filling the outer shell case 1 with the resin in high density. Therefore, the outer shell case 1 shown in the present embodiment does not require an air releasing duct for resin filling.

Then, after the filled resin is hardened, the projecting pieces 52a–52b of the pipe 52 are pinched to rotate the pipe 52 around the axis so as to detach the pipe 52 from the pin holder 50 (step 1108). This results in a finished proximity sensor.

As described above, according to the proximity sensor 100 of the present embodiment, the connector comprises the terminal pin assembly 5 sized to be able to be inserted from the front-end side of the outer shell case and the receptacle 6 fixed from the rear-end side of the outer shell case 1. In addition, the provision of the flexible connection member 3 disposed between the detection end module 2 and the terminal pin assembly 6 enables the terminal pin assembly 5 to be positioned relative to the outer shell case 1 in high precision via the receptacle 6 in the conditions that the electrically connected article is fixed to the outer shell case 1.

Furthermore, the flexible connection member 3 can be designed to be comparatively short because it should only be long enough to enable the terminal pin assembly 5 to move as required for the assembling processes shown in steps 1104 and 1105. If the connector forms as one component, and is inserted from the rear-end side of the outer shell case land press-fitted, the output circuit assembly 4 must be drawn through the rear opening of the outer shell case 1 and soldered or the like to the connector, which requires that the connection member 3 should be comparatively long. In contrast, in the proximity sensor of the present embodiment, the accommodation space for the connection member 3 in the outer shell case 1 can be reduced and the connection member 3 unlikely hinders resin flow while the resin is filled into the outer shell case 1. Furthermore, the connection member 3 is less resin -molded when it is in contact with the outer shell case 1, thereby securing isolation between the outer shell case 1 and the connection member 3.

Figure 12:
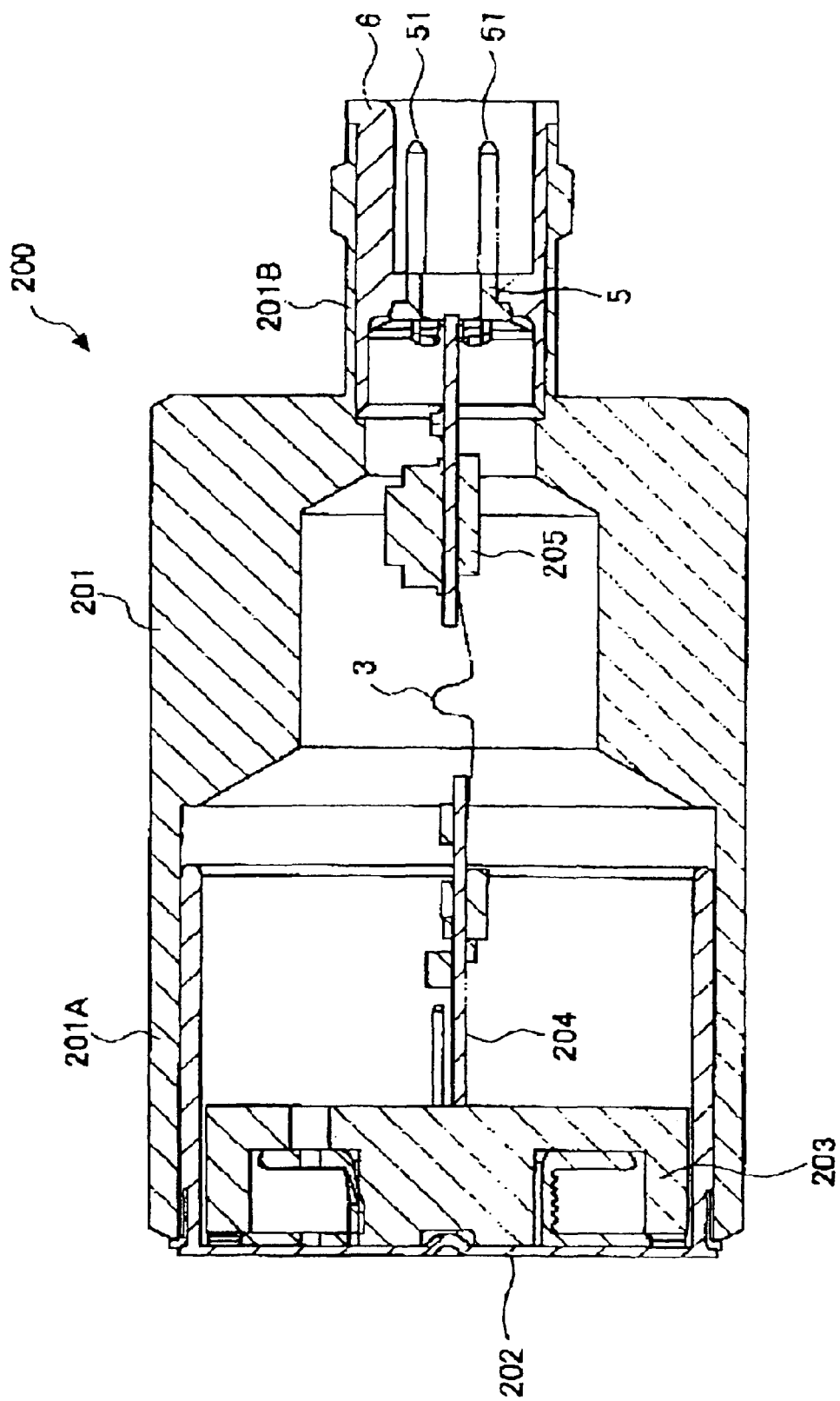
FIG. 12 is a cross sectional view showing another proximity sensor (the second embodiment) of the present invention.
Figure 13:
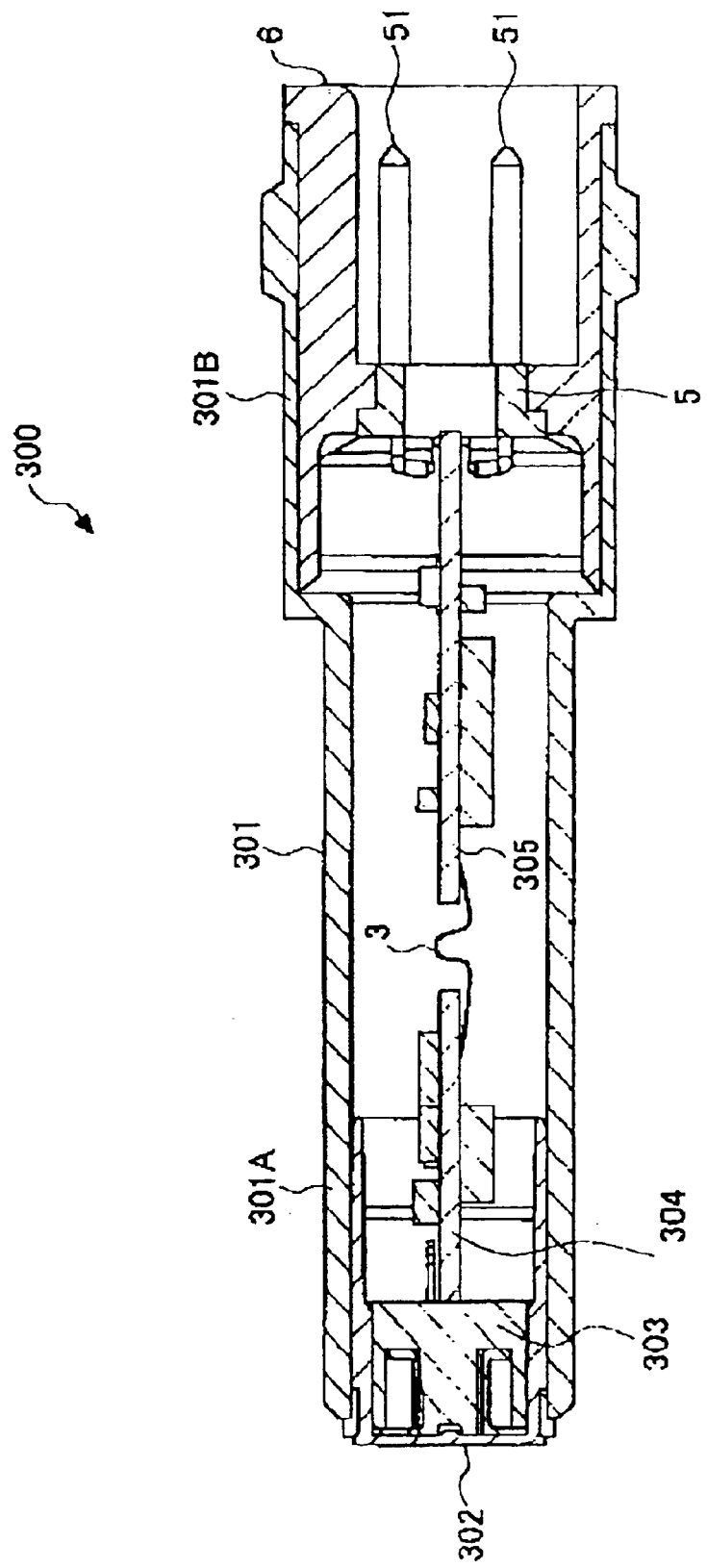
FIG. 13 is a cross sectional view showing another proximity sensor (the third embodiment) of the present invention.

Finally, the proximity sensors of other embodiments of the present invention are shown in FIG. 12 (the second embodiment) and FIG. 13 (the third embodiment).

As shown in FIG. 12 the proximity sensor 200 of the second embodiment is a long-range proximity sensor which can detect farther objects than the proximity sensor 100 of the first embodiment. In the proximity sensor 200, the large-sized detection end module 202, which accommodates the detection coil assembly 203 including a coil of a larger diameter and a core and the detection circuit assembly 204, is fixed in the front-end part 201A of the outer shell case 201. On the other hand, the connector comprises the same terminal pin assembly 5 and the receptacle 6 as those of the first embodiment. To be more specific, the outer shell case 201 shown in the drawing has the front-end part 201A larger in diameter (the so-called outer diameter of the outer shell case) than that in the outer shell case 1 of the first embodiment and the rear-end part 201B (connector attachment part) the same in diameter as that in the outer shell case 1 of the first embodiment shown in FIG. 2.

As shown in FIG. 13, the proximity sensor 300 of the third embodiment is a short-range proximity sensor which can detect close objects than the proximity sensor 100 of the first embodiment. In the proximity sensor 300, a small-sized detection end module 302, which accommodates the detection coil assembly 303 including a coil of a smaller diameter and a core and the detection circuit assembly 304, is fixed in the front-end part 301A of the outer shell case 301. On the other hand, the connector comprises the same terminal pin assembly 5 and the receptacle 6 as those of the first embodiment. To be more specific, the outer shell case 201 shown in the drawing has the front-end part 301A smaller in diameter (the outer diameter of the outer shell case) than that in the outer shell case 1 of the first embodiment and the rear-end part 301B (connector attachment part) the same in diameter as that in the outer shell case 1 of the first embodiment shown in FIG. 2.

In the proximity sensor of the present invention in which the terminal pin assembly 5 is inserted from the front side of the outer shell case 1, whereas the receptacle 6 is fixed from the rear side, and these are assembled inside the outer shell case so as to form the connector, the same connector can be employed when outer shell cases of different outer diameters are manufactured.

In general, the outer diameter of the outer shell case is determined according to the size of the coil and core which affect detecting properties. Therefore, in the model where the connector assembly (corresponding to an integrated component of a terminal pin assembly and a receptacle) is inserted from the front side of the outer shell case in assembling the proximity sensor, the same connector can be applied only to outer shell cases having a larger diameter than the outer diameter of the connector (corresponding to the outer diameter of the receptacle). This difference in diameter becomes remarkable particularly when as shown in the third embodiment, the terminal pin assembly 5 can be inserted from the front-end side of the outer shell case 301 and the diameter of the receptacle 6 is larger than the outer diameter of the outer shell case 301 (the diameter of the front-end part 301A). In other words, in the model where a connector assembly is inserted from the front side of the outer shell case in assembling a proximity sensor, it is impossible to realize the proximity sensor shown in the third embodiment (the proximity sensor in which the same connector as those in the first and second embodiments is applied to the outer shell case 301).

In the aforementioned embodiments, the connection member 3 is disposed between two circuit boards (the detection circuit assembly 21 and the output circuit assembly 4); however, when only one circuit board is used, the connection member 3 can be disposed between the terminal pin assembly 5 and the circuit board so as to obtain the same effects.

In addition, in the aforementioned embodiments, the terminal pin assembly 5 with a pipe is used to enable the terminal pin assembly 5 and the receptacle 6 to be fitted to each other inside the outer shell case. However, the fitting between the terminal pin assembly 5 and the receptacle 6 can be done without using the terminal pin assembly 5 with a pipe shown in the aforementioned embodiments, by previously providing an engaging part to the terminal pin assembly 5 and hooking the engaging part with a jig and pulling it, or pulling the terminal pins 51 of the terminal pin assembly 5.

In the aforementioned embodiments, the terminal pin assembly 5 is designed to be press-fitted into the receptacle 6; however, the fitting between the terminal pin assembly 5 and the receptacle 6 can be done by employing snap fit or another fixing structure.

As apparent from the aforementioned explanation, according to the present invention, in the proximity sensor comprising a detection coil assembly including a coil and a core; a circuit assembly incorporating an oscillation circuit using the coil as a resonant circuit element and an output circuit for generating an output signal based on the oscillating condition of the oscillation circuit; a plug-adaptable connector; and a cylindrical outer shell case for accommodating all of these components integrally connected with each other, the connector conductive terminal can be positioned in high precision relative to the outer shell case in assembling the sensor, thereby improving assembling performance.

What is claimed is:

1. A proximity sensor comprising:
   a cylindrical outer shell case;
   a detection coil assembly which includes a coil and a core and which is fitted to a front-end side of the outer shell case;
   a plug-adaptable connector which is fitted to a rear-end side of the outer shell case; and
   a circuit assembly which is disposed between the detection coil assembly and the connector and which incorporates an oscillation circuit using the coil as a resonant circuit element and an output circuit for generating an output signal based on the oscillating condition of the oscillation circuit, wherein
   the connector comprises:
   a conductive terminal assembly which includes a plug-adaptable conductive terminal electrically connected with the circuit assembly and a pin holder for holding the conductive terminal, and which is sized to be able to be inserted from the front-end side of the outer shell case; and
   a cylindrical holding member which has openings at both ends so as to enable the conductive terminal assembly to be inserted, which also has a joint part inside to enable the conductive terminal assembly to be positioned thereto, and which is fixed from the rear-end side of the outer shell case, and
   the detection coil assembly and the conductive terminal assembly are electrically connected with each other with a flexible connection member disposed therebetween.

2. The proximity sensor of claim 1, wherein
   the circuit assembly comprises:
   a first circuit board containing a detection circuit which is equipped with the oscillation circuit using the coil of the detection coil assembly as the resonant circuit element and which generates an object detection signal according to the oscillating condition of the oscillation circuit; and
   a second circuit board containing the output circuit which drives an output element based on the object detection signal,
   the first circuit board is supported by and electrically connected with the detection coil assembly,
   the second circuit board is supported by and electrically connected with the conductive terminal assembly, and
   the first circuit board and the second circuit board are electrically connected with each other via the flexible connection member.

3. The proximity sensor of claim 1 or 2, wherein
   the pin holder of the conductive terminal assembly is press-fitted into the joint part of the holding member, so as to position the conductive terminal assembly to the holding member.

4. A method for manufacturing a proximity sensor, comprising the steps of:
   preparing a yet-to-be-completed product including: a detection coil assembly which includes a coil and a core; a circuit assembly which incorporates an oscillation circuit using the coil as a resonant circuit element and an output circuit for generating an output signal based on the oscillating condition of the oscillation circuit; and a conductive terminal assembly including a plug-adaptable conductive terminal held by a pin holder; the detection coil assembly, the circuit assembly and the conductive terminal assembly being electrically connected in this order by disposing at least one flexible connection member in the yet-to-be-completed product; a cylindrical holding member which has openings at both ends so as to enable the conductive terminal assembly to be inserted and which also has a joint part inside to enable the conductive terminal assembly to be positioned to the holding member, and a cylindrical outer shell case for integrally accommodating the yet-to-be-completed product and the holding member;
   inserting the yet-to-be-completed product from a front-end side of the outer shell case from the conductive terminal assembly side and press-fitting the detection coil assembly to the front-end side of the outer shell case;
   press-fitting the holding member to a rear-end side of the outer shell case; and
   fixing the conductive terminal assembly to the joint part of the holding member by moving the pin holder of the conductive terminal assembly inside the outer shell case through the openings of the holding member.

5. A method for manufacturing a proximity sensor, comprising the steps of:
   preparing a yet-to-be-completed product including: a detection coil assembly which includes a coil and a core; a circuit assembly which incorporates an oscillation circuit using the coil as a resonant circuit element and an output circuit for generating an output signal based on the oscillating condition of the oscillation circuit; and a conductive terminal assembly which includes a plug-adaptable conductive terminal, a pin holder which holds the conductive terminal and is equipped with a through hole, and a pipe integral with the pin holder via a coupling part that can be cut easily and forming a resin flow path together with the through hole; the detection coil assembly, the circuit assembly and the conductive terminal assembly being electrically connected in this order by disposing at least one flexible connection member in the yet-to-be-completed product; a cylindrical holding member which has openings at both ends so as to enable the conductive terminal assembly to be inserted and which also has a joint part inside so as to enable the conductive terminal assembly to be positioned to the holding member; and a cylindrical outer shell case for integrally accommodating the yet-to-be-completed product and the holding member;

inserting the yet-to-be-completed product from a front-end side of the outer shell case from the conductive terminal assembly side and press-fitting the detection coil assembly to the front-end side of the outer shell case;

drawing the pipe of the conductive terminal assembly from the outer shell case and inserting into the holding member;

press-fitting the holding member to a rear-end side of the outer shell case;

fixing the conductive terminal assembly to the joint part of the holding member by manipulating the pipe inserted into the holding member;

filling resin into the outer shell case through the pipe; and detaching the pipe from the conductive terminal assembly.

6. A method for manufacturing a proximity sensor, comprising the steps of:

preparing a yet-to-be-completed product including: a detection coil assembly which includes a coil and a core; a circuit assembly which includes a detection circuit board containing an oscillation circuit using the coil as a resonant circuit element and a detection circuit for generating an object detection output signal according to the oscillating condition of the oscillation circuit, and an output circuit board containing an output circuit for driving an output element based on the object detection output signal, the detection circuit board and the output circuit board being electrically connected with each other by a flexible connection part disposed therebetween; and a conductive terminal assembly including a plug-adaptable conductive terminal held by a pin holder; the detection coil assembly, the circuit assembly and the conductive terminal assembly being electrically connected with each other; a cylindrical holding member which has openings at both ends so as to enable the conductive terminal assembly to be inserted and which also has a joint part inside to enable the conductive terminal assembly to be positioned to the holding member; and a cylindrical outer shell case for integrally accommodating the yet-to-be-completed product and the holding member;

inserting the yet-to-be-completed product from a front-end side of the outer shell case from the conductive terminal assembly side and press-fitting the detection coil assembly through a coil case to the front-end side of the outer shell case;

press-fitting the holding member to a rear-end side of the outer shell case; and fixing the conductive terminal assembly to the joint part of the holding member by moving the pin holder of the conductive terminal assembly inside the outer shell case through the openings of the holding member.

7. A method for manufacturing a proximity sensor, comprising the steps of:

preparing a yet-to-be-completed product including: a detection coil assembly which includes a coil and a core; a circuit assembly which includes a detection circuit board containing an oscillation circuit using the coil as a resonant circuit element and a detection circuit for generating an object detection output signal according to the oscillating condition of the oscillation circuit, and an output circuit board containing an output circuit for driving an output element based on the object detection output signal, the detection circuit board and the output circuit board being electrically connected with each other by a flexible connection part disposed therebetween; and a conductive terminal assembly which includes a plug-adaptable conductive terminal, a pin holder which holds the conductive terminal and is equipped with a through hole, and a pipe integral with the pin holder via a coupling part that can be cut easily and forming a resin flow path together with the through hole; a cylindrical holding member which has openings at both ends so as to enable the conductive terminal assembly to be inserted and which also has a joint part inside so as to enable the conductive terminal assembly to be positioned to the holding member; and a cylindrical outer shell case for integrally accommodating the yet-to-be-completed product and the holding member;

inserting the yet-to-be completed product from a front-end side of the outer shell case from the conductive terminal assembly side and press-fitting the detection coil assembly to the front-end side of the outer shell case;

drawing the pipe of the conductive terminal assembly from the outer shell case and inserting into the holding member;

press-fitting the holding member to a rear-end side of the outer shell case;

fixing the conductive terminal assembly to the joint part of the holding member by manipulating the pipe inserted into the holding member;

filling resin into the outer shell case through the pipe; and detaching the pipe from the conductive terminal assembly.

8. A method for manufacturing a proximity sensor, the method enabling the manufacture of proximity sensors of which enables the manufacture of proximity sensors having different outer diameters by using comprising:

preparing a kind of connector comprising a terminal assembly having a pin holder for holding a plug-adaptable conductive terminal and a cylindrical holding member having openings at both ends so as to enable the conductive terminal assembly to be inserted therein from one of the openings and which also has a joint part inside so as to enable the conductive terminal assembly to be positioned to the holding member, the conductive terminal assembly and the holding member being integrated via the joint part;

selecting one of a plurality of outer shell cases of different outer diameters, fixing the holding member from a rear-end side of the selected one of the plurality of outer shell cases, inserting the conductive terminal assembly from a front-end side of the selected one of the plurality of outer shell cases, and connecting the conductive terminal assembly with the holding member.

* * * * *